(12) United States Patent
Prete et al.

(10) Patent No.: US 6,836,162 B2
(45) Date of Patent: Dec. 28, 2004

(54) METHOD AND ARRANGEMENT FOR FREQUENCY DOUBLING

(75) Inventors: Edoardo Prete, München (DE); David Müller, München (DE)

(73) Assignee: Infineon Technologies AG, München (DE)

(*) Notice: Subject to any disclaimer, the term of this patent is extended or adjusted under 35 U.S.C. 154(b) by 0 days.

(21) Appl. No.: 10/425,635

(22) Filed: Apr. 30, 2003

(65) Prior Publication Data

US 2003/0227312 A1 Dec. 11, 2003

(30) Foreign Application Priority Data

Apr. 30, 2002 (DE) .......................... 102 19 374

(51) Int. Cl.[7] .............................................. H03B 19/00
(52) U.S. Cl. ..................... 327/113; 327/116; 327/119
(58) Field of Search ............................... 327/113, 116, 327/119–122, 356, 357, 359

(56) References Cited

U.S. PATENT DOCUMENTS 3,622,210 A   11/1971  Thelen et al. ............... 327/122
5,864,246 A *  1/1999  Anderson ................... 327/122

FOREIGN PATENT DOCUMENTS

EP       1 187 310 A2    3/2002

* cited by examiner

Primary Examiner—Kenneth B. Wells
(74) Attorney, Agent, or Firm—Fitzpatrick, Cella, Harper & Scinto

(57) ABSTRACT

To generate an output signal (11) the frequency of which is twice the frequency of an input signal (1, 2), a delayed signal (3, 4) which is delayed relative to the input signal (1, 2) by a quarter of the latter's cycle period is generated and the output signal (11) is then generated as the difference between the rectified input signal (1, 2) and the rectified delayed signal (3, 4). The input signal (1, 2) and the delayed signal (3, 4) are advantageously rectified by using differential signals each comprising a positive component signal (1, 3) and a negative component signal (2, 4). A respective one of two transistors connected in parallel is driven by a positive component signal (1, 3) and a negative component signal (2, 4) in such a way that a positive half-wave causes the relevant transistor (5–8) to conduct and the relevant transistor (5–8) blocks in a negative half-wave. The rectified input signal (1, 2) or delayed signal (3, 4) is obtained from the two component currents flowing through the pairs of transistors (5–8) connected in parallel when the currents are added. The rectified input signal (1, 2) and delayed signal (3, 4), which are in the form of current signals, can be passed through two resistors (9, 10) to enable corresponding voltage signals to be generated across the latter and the output signal (11) to be picked off from the two resistors (9, 10).

15 Claims, 2 Drawing Sheets

METHOD AND ARRANGEMENT FOR FREQUENCY DOUBLING

BACKGROUND OF THE INVENTION

Description of the Related Art

The present invention relates to a method and an arrangement for generating an output signal the frequency of which is twice the frequency of an input signal.

In a known method of frequency doubling, a cyclic input signal is multiplied by the input signal which has been delayed by a quarter of the cycle period. A typical implementation of such a method is, for example, the Gilbert multiplier. An arrangement of this kind is known from EP 1 187 310 A2, for example.

A particular disadvantage which known arrangements of this kind suffer from is that they are made up of a relatively large number of components and have a large number of nodes to which an a.c. signal is applied. The disadvantage this has, particularly at high frequencies, is that the capacitive load becomes very high and integration becomes difficult.

SUMMARY OF THE INVENTION

This disadvantage is overcome in accordance with the invention by a method having the features given in claim 1 and by an arrangement having the features given in claim 9.

In accordance with the present invention, an input signal and a delayed signal are rectified and the difference between the rectified signals is determined. The delayed signal may be generated as a function of the input signal in this case, in which case the delayed signal is delayed relative to the input signal by a quarter of the latter's cycle period but is of the same frequency. Often however, the delayed signal will already exist, as will be the case for example when use is made of an oscillator which produces two signals which are shifted by a quarter of the cycle period and of which one can then used as the input signal and the other as the delayed signal. The present invention is based on the fact that a rectified trigonometrical function given by the following formula can be described as a series expansion of a trigonometrical function of twice the frequency, with the higher terms being severely damped in this case.

$$\text{abs}(\sin(2\pi f t)) = \frac{2}{\pi} - \frac{4}{\pi} \sum_{i=1}^{\infty} \frac{\cos(2\pi f \cdot 2i \cdot t)}{4i^2 - 1}$$

$$\text{abs}(\cos(2\pi f t)) = \frac{2}{\pi} - \frac{4}{\pi} \sum_{i=1}^{\infty} (-1)^i \frac{\cos(2\pi f \cdot 2i \cdot t)}{4i^2 - 1}$$

Because the sine function is delayed by a quarter of the cycle period relative to the cosine function, the input signal and the delayed signal can be associated with a cosine function and a sine function respectively. Once the difference between the rectified input signal and the rectified delayed signal has been formed, what is obtained is the following formula as a series expansion of the output signal.

$$\text{abs}(\cos(2\pi f t)) - \text{abs}(\sin(2\pi f t)) = \frac{8}{\pi} \sum_{i=1}^{\infty} \frac{\cos(2\pi f \cdot 2(2i+1) \cdot t)}{4(2i+1)^2 - 1}$$

It can be seen from this formula that a dominant term appears on the right-hand side at twice the input frequency and that the higher-frequency terms are severely damped. Advantageously, it is only uneven multiples of the desired output frequency that appear. This fact is particularly advantageous to enable jitter to be avoided.

This method of frequency doubling is particularly suitable for implementation in a semiconductor chip. For this purpose, use is made of a differential input signal and a differential delayed signal which each comprise a positive and a negative component signal. The component signals of the input signal and the component signals of the delayed signal are, for their part, once again cyclic signals but they have different signs, which means that the positive half-waves of one component signal are in phase with the negative half-waves of the other component signal. By means of the component signals of both the input signal and the delayed signal, signals are applied to circuit-switching elements, such as transistors for example, with each current-switching element being so controlled by a component signal that the positive and negative half-waves of the component signal are converted at different gains into component currents flowing through the current-switching elements. Provision may in particular be made for the corresponding current-switching element to block at a positive or negative half-wave of one component signal. This may, for example, be achieved by controlling a transistor by means of a voltage, in which case the negative half-waves of the voltage cause a negative voltage to be applied to the control input of the transistor, which may be the base or gate, for example.

The two component currents which flow through the current-switching elements to which the component signals of either the input signal or the delayed signal are applied are added and thus form a summed signal which corresponds to the rectified input signal or the rectified delayed signal. For rectification of this kind to work, it is essential for the positive and negative half-waves of the component signals not to be converted into currents in the same way. As soon as either the positive or the negative half-waves of the component signals produce a current which is less than proportional, due in particular to blocking of the current switching element, what is produced by the summing of two component currents is rectification either of the input signal or of the delayed signal, and this in itself gives twice the frequency.

The two summed signals are current signals which generate a voltage signal across a resistor or reactor, i.e. an impedance, which means that the output signal can be generated at little cost or complication by means of two resistors or reactors to each of which one summed signal is applied. For this, it is enough for one end of each of the two resistors or reactors to be held at a constant voltage to enable the output signal to be picked off from the other ends of respective resistors or reactors. The resistors or reactors may be ohmic resistors or inductive reactors or a combination of ohmic resistors and inductive reactors. What may also be used as resistors or reactors are semiconductor structures, such as field-effect transistors for example, which are operated in particular in the linear range.

In an advantageous embodiment, the output signal may be filtered to remove unwanted signal components. What may be used in this case is in a particular a low-pass filter or a band-pass filter, in which case the filtering and the nature of the filtering will be suited to the intended field of application of the invention.

BRIEF DESCRIPTION OF THE DRAWINGS

The invention will be explained in detail below by reference to a preferred embodiment and to the accompanying drawings.

DETAILED DESCRIPTION

Figure 1:
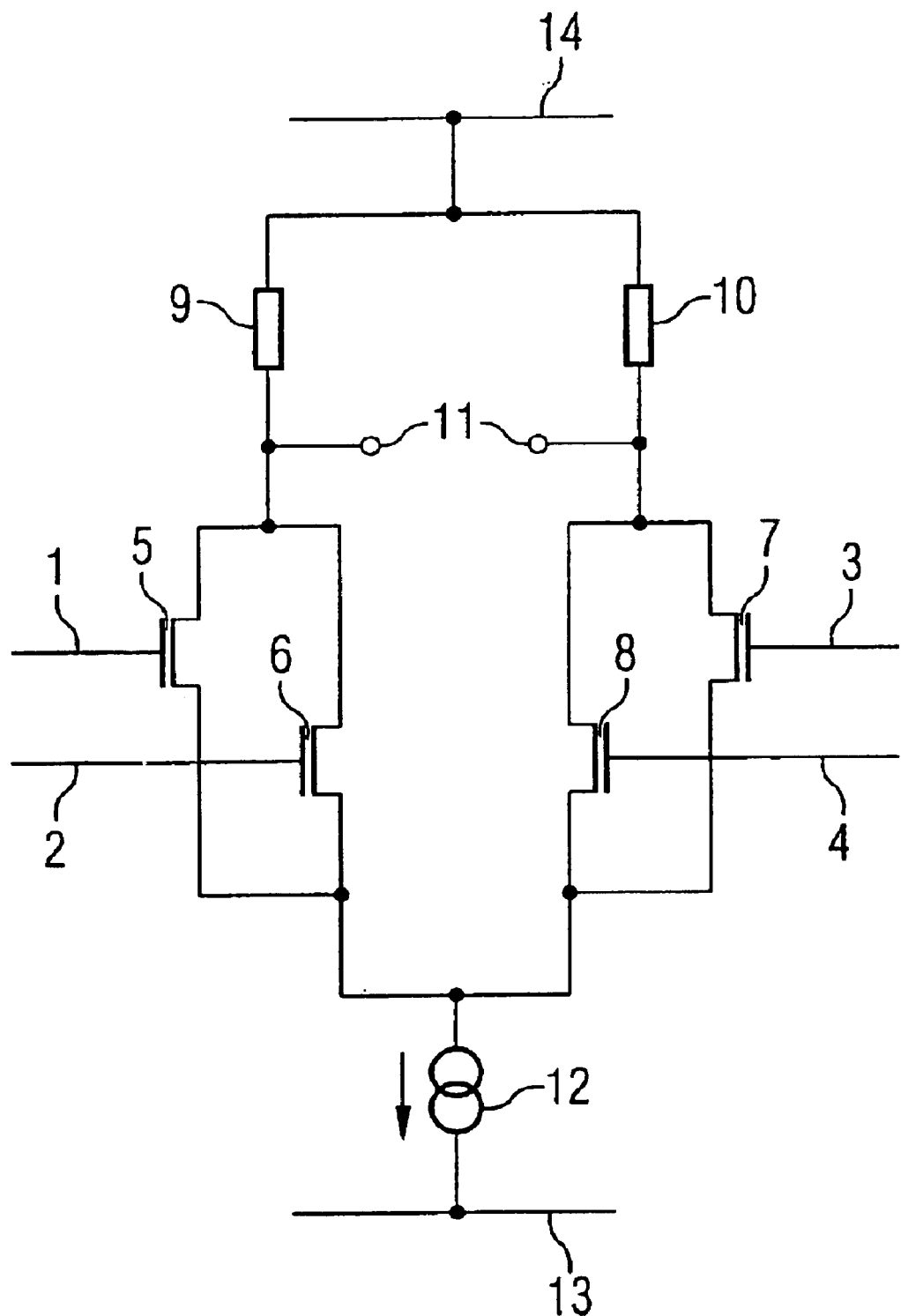
FIG. 1 shows in this case the layout of the embodiment of the circuit according to the present invention for frequency doubling.
Figure 2:
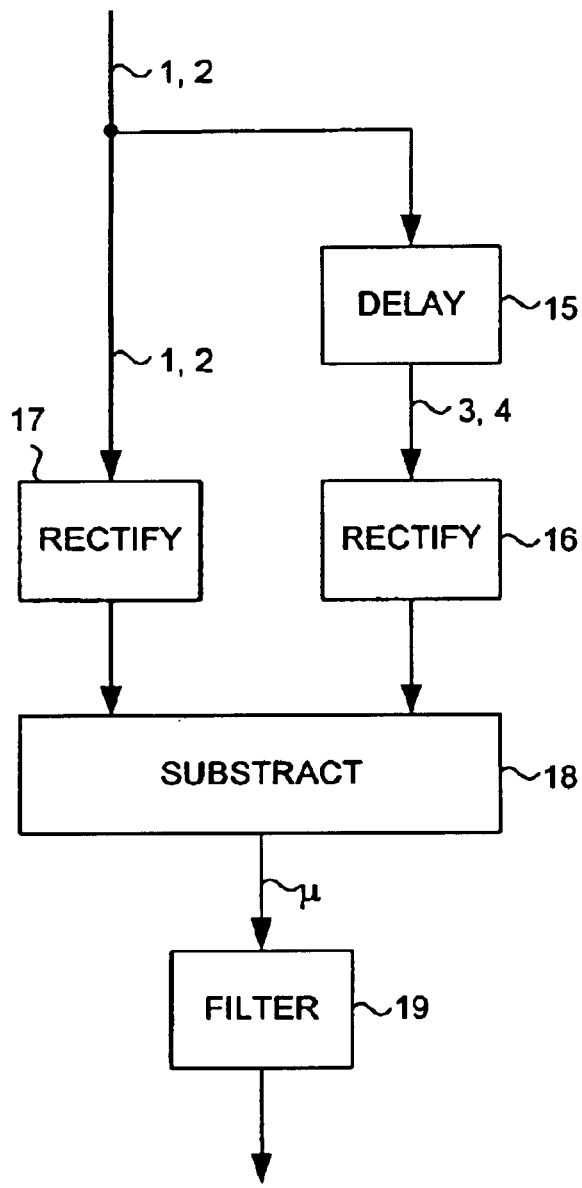
FIG. 2 shows a flow chart depicting a method performed according to a preferred embodiment of the invention.
Figure 3:
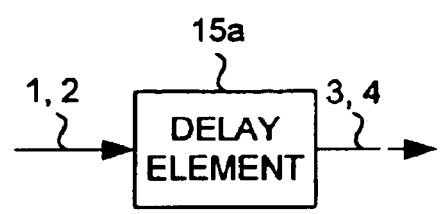
FIG. 3 shows a delay element 15a employed in a delaying step 15 of the method of FIG. 2.

The circuit shown in the Figure is used to generate an output signal 11 the frequency of which is twice the frequency of the input signal 1, 2. The input signal 1, 2 is differential and is transmitted by means of two component signals 1, 2 which comprise a positive component signal 1 and a negative component signal 2. The input signal 1, 2 is a sinusoidal signal and the two component signals 1, 2 are therefore sinusoidal likewise but are of different signs. A delayed signal 3, 4 is generated by means of an arrangement which is not shown, and it too is differential and is transmitted in the form of two component signals 3, 4, component signal 3 being the positive component signal of delayed signal 3, 4 and component signal 4 being its negative component signal. The delayed signal 3, 4 represents the input signal 1, 2 after being delayed by a quarter of its cycle period. The component signals 3, 4 of the delayed signal are likewise sinusoidal signals but they are of different signs and are delayed relative to the component signals 1, 2 of the input signal by a quarter of the cycle period.

The circuit used for frequency doubling comprises four field-effect transistors 5–8 which are each driven by one of the component signals 1–4.

The field-effect transistors 5, 6 which are driven by the component signals 1, 2 of the input signal are connected in parallel at their drain terminals and source terminals. The same is true of the field-effect transistors 7, 8 which are driven by the two component signals 3, 4 of the delayed signal.

The source terminals of all the field-effect transistors 5–8 are connected together and are connected via a constant-current source 12 to a negative pole 13 of a voltage supply source. The drain terminals of the field-effect transistors 5, 6 which are driven by the input signal 1, 2 are connected via a resistor 9 to a positive pole 14 of the voltage supply. The drain terminals of the field-effect transistors 7, 8 which are driven by the delayed signal 3, 4 are likewise connected, via a second resistor 10, to the positive pole 14 of the voltage supply.

All the component signals 1–4 are so arranged in relation to the voltage supply 13, 14 that they can cause respective ones of the field-effect transistors 5–8 to conduct in the positive half-waves and that respective ones of the field-effect transistors 5–8 block during at least part of the negative half-waves. This may, for example, be achieved by setting the mean value of the component signals 1–4 at a voltage level which is at least substantially at the same voltage as the source terminals of the field-effect transistors 5–8. For this purpose, the component signals 1–4 may have superimposed on them a direct component, in which case the setting of the component signals 1–4 will also be suited to the type and transfer characteristic of the field-effect transistor 5–8.

Because it is the two component signals 1, 2 of the input signal which drive the two field-effect transistors 5, 6, it being substantially only the positive half-waves of the two component signals 1, 2 which cause the field-effect transistors 5, 6 to conduct, the sum current which flows through the two field-effect transistors 5, 6, and thus through the first resistor 9, is one which has the waveform of a rectified sinusoidal signal. The same is true of the current which flows through the two field-effect transistors 7, 8 which are driven by the delayed signal 3, 4 and through the second resistor 10, the current flowing through the second resistor 10 being delayed relative to the current flowing through the first resistor 9 by a quarter of the cycle period which exists at the frequency of the input signal 1, 2 and the delayed signal 3, 4.

Due to the rectification, the currents flowing through the two resistors 9, 10 are already doubled in frequency, the current waveform having however a large number of harmonics. The output signal 11 is picked off from the two nodes at which the two resistors 9, 10 are respectively connected to their associated field-effect transistors 5–8. The output signal 11 which is obtained in this way corresponds to the difference between the voltage drops which are generated across the resistors 9, 10 and it is of a substantially sinusoidal waveform. By means of the present invention, it is possible in this way, at little cost or complication and in particular with only a small number of components, to obtain an output signal of doubled frequency, the waveform of the output signal 11 being low in harmonics.

A major advantages results from the reduced number of components at high input frequencies, particularly ones equal to or greater than 1 gigahertz. Because of the small number of components, it is possible for a circuit of this kind to be implemented in a semiconductor chip considerably more easily than it is with the frequency doubling circuits known in the past.

Figure 4:
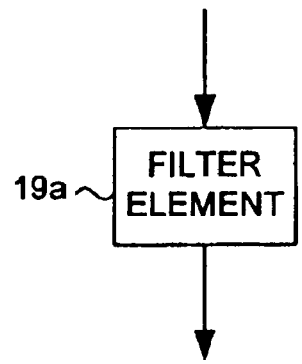
FIG. 4 shows a filter element 19a employed in a filtering step 19 of the method of FIG. 2.

Referring now to FIGS. 1–4, a method of generating a cyclic output signal having a frequency which is twice that of a cyclic input signal, according to the invention, will now described. According to a preferred embodiment of the invention, the method comprises delaying an input signal 1, 2 (step 15) using a delay element 15a (FIG. 3) to provide a delayed signal 3, 4 which corresponds to the input signal 1, 2 delayed by a quarter of a cycle period of the input signal, and rectifying the delayed signal 3, 4 (step 16). The method also includes rectifying the input signal 1, 2 (step 17), performing a subtraction (step 18) to generate a resulting difference signal representing a difference between the signals rectified in the rectifying steps 16 and 17, and filtering (step 19) the difference signal through a filter element 19a (FIG. 4). Preferably, the filtering performed in step 19 has reduced or minimal damping at twice the frequency of the input signal. At least one of the input signal and the delayed signal is differential.

It should be noted that the delaying step 15 and filtering step 19 are optional steps, and, in other embodiments, they need not be performed at all, depending on the application of interest. Indeed, unlike the steps of rectifying an input signal (step 17), rectifying a delayed signal (step 16), and subtracting the corresponding rectified signals (step 18), the delaying step 15 and filtering step 19 are not considered germane to the present invention and the steps 15 and 19 and elements 15a and 19a need not be employed at all in some embodiments.

What is claimed is:

1. Method of generating a cyclic output signal, a frequency of which is twice a frequency of a cyclic input signal, the method comprising:

rectifying a delayed signal, which corresponds to the input signal delayed by a quarter of a cycle period of the input signal, and the input signal; and forming and outputting as an output signal a difference between the input signal and the delayed signal rectified in the rectifying.

2. Method according to claim 1, wherein the delayed signal is generated from the input signal by applying a delay of one quarter of the cycle period of the input signal.

3. Method according to claim 1, further comprising filtering the output signal, the filtering having reduced or minimal damping at twice the frequency of the input signal.

4. Method according to claim 1, wherein at least one of the input signal and the delayed signal is differential.

5. Method according to claim 1, wherein the input signal and the delayed signal are differential and each have a negative and a positive component signal, and wherein the rectifying includes driving current-switching elements by means of respective component signals of the input signal and the delayed signal in such a way that component currents flowing through the current-switching elements always have a same sign, and converting positive and negative half-waves of the component signals into the component currents, respectively, at different gains, and adding the component currents flowing through the current-switching elements driven by the component signals of the input signal and the delayed signal to form first and second summed signals, respectively, the summed signals respectively corresponding to the input signal and the delayed signal after being rectified in the rectifying.

6. Method according to claim 5, wherein the current-switching elements are driven by means of the component signals in such a way that the current-switching elements block in the negative or positive half-waves of the component signals.

7. Method according to claim 5, wherein the summed signals are passed through respective resistors or reactors and the output signal is generated as a difference between voltage drops across the resistors or reactors, respectively.

8. Method according to claim 5, wherein a constant current is applied to all current paths through the current-switching elements.

9. Arrangement for generating a cyclic output signal, a frequency of which is twice a frequency of a cyclic input signal, the arrangement comprising two rectifying means for rectifying both the input signal and a delayed signal which corresponds to the input signal delayed by a quarter of a cycle period of the input signal, and means for forming a difference between the input signal and the delayed signal rectified by the two rectifying means, and for feeding out the difference as an output signal.

10. Arrangement according to claim 9, further comprising delaying means to generate the delayed signal from the input signal by applying a delay of a quarter of the cycle period of the input signal.

11. Arrangement according to claim 9, further comprising a filter for filtering the output signal, the filter having reduced or minimal damping at twice the frequency of the input signal.

12. Arrangement according to claim 9, wherein the input signal and the delayed signal are difference signals each having a negative and a positive component signal, and the arrangement has four current-switching elements, to each of which a component signal is applied in such a way that component currents flowing through the current-switching elements are always of a same polarity and positive and negative half-waves of the component signals are converted into current by the current-switching elements at different gains, the arrangement being so arranged that the component currents flowing through the current-switching elements driven by the component signals of the input signal and the delayed signal respectively are added to form first and second summed signals respectively, and the difference between the input signal and the delayed signal rectified by the two rectifying means is formed by forming a difference between the summed signals.

13. Arrangement according to claim 12, wherein the arrangement is so arranged that the current-switching elements block in the positive or the negative half-waves of the component signals.

14. Arrangement according to claim 12, wherein the arrangement further comprises two resistors or reactors to each of which a summed signal is applied, and the arrangement is so arranged that it forms a difference between voltage drops across the two resistors or reactors, respectively, as an output signal.

15. Arrangement according to claim 12, wherein the arrangement has a current source which is connected to current paths of all the current-switching elements.

* * * * *